United States Patent [19]
Iizuka

[11] Patent Number: 5,487,811
[45] Date of Patent: Jan. 30, 1996

[54] PROCESS FOR PREPARATION OF SEMICONDUCTOR DEVICE

[75] Inventor: Katsuhiko Iizuka, Kawasaki, Japan

[73] Assignee: Fujitsu Limited, Kanagawa, Japan

[21] Appl. No.: 748,157

[22] Filed: Aug. 21, 1991

[30] Foreign Application Priority Data

Aug. 23, 1990 [JP] Japan ................... 2-224030

[51] Int. Cl.$^6$ .................................. H01L 21/00
[52] U.S. Cl. ................ 156/656.1; 437/192; 437/200
[58] Field of Search ..................... 156/643, 646, 156/662, 664, 656, 659.1; 437/192, 200

[56] References Cited

U.S. PATENT DOCUMENTS

| | | | |
|---|---|---|---|
| 4,478,678 | 10/1984 | Watanabe | 156/643 |
| 4,539,742 | 9/1985 | Kanzaki et al. | 156/647 |
| 4,744,861 | 1/1988 | Matsunaga et al. | 156/643 |
| 4,778,563 | 10/1988 | Stone | 156/646 |
| 4,784,720 | 11/1988 | Douglas | 156/646 |
| 4,789,426 | 12/1988 | Pipkin | 156/646 |
| 4,799,991 | 1/1989 | Dockrey | 156/646 |
| 4,833,096 | 5/1989 | Huang et al. | 156/644 |
| 5,007,982 | 4/1991 | Tson | 156/646 |
| 5,030,590 | 7/1991 | Amini et al. | 437/228 |
| 5,110,411 | 5/1992 | Long | 156/659.1 |

FOREIGN PATENT DOCUMENTS

| | | |
|---|---|---|
| 127268 | 3/1984 | European Pat. Off. . |
| 195477 | 3/1986 | European Pat. Off. . |
| 284308 | 3/1988 | European Pat. Off. . |
| 328350 | 2/1989 | European Pat. Off. . |
| 02094520 | 4/1990 | Japan . |

OTHER PUBLICATIONS

"Precision 5000 Etch: Tungsten Silicide Process Capability"; Applied Materials, Inc., vol. VII, No. 1, Spring 1990, by Lum et al., pp. 1–19.

"Plasma Etching of Composite Silicide Gate Electrodes", F. R. White et al, 1046 Journal of the Electrochemical Society, vol. 129 (1982) Jun., No. 6, pp. 1330–1335.

"The Control of Plasma Etch Selectivities Via Oxygen Addition to Chlorine Based Plasmas", Francine Y. Robb, 8182 Motorola Technical Developments, 4(1984) Apr., No. 1, pp. 28–29.

"Perfect Selective and Highly Anisotropic Electron Cyclotron Resonance Plasma Etching for Wsi$_x$/poly–Si at Electron Cyclotron Resonance Position", Seiji Samukawa et al, 8257b Journal of Vacuum Science & Technology Part B, 8(1990) Sep./Oct., No. 5, pp. 1062–1067.

Primary Examiner—R. Bruce Breneman
Assistant Examiner—George Goudreau
Attorney, Agent, or Firm—Nikaido, Marmelstein, Murray & Oram

[57] ABSTRACT

A process for the preparation of a semiconductor device, includes the steps of, (a) forming a mask including an organic film on a laminated film consisting of a metal silicide layer and a non-single crystalline silicon layer formed over a substrate on which an oxide layer is formed, (b) etching the laminated film under a plasma atmosphere of a mixed gas including a chlorine gas and an oxygen gas by heating the substrate to a temperature of 60° C. or more to fabricate the laminated film into an almost vertical pattern in section, and (c) removing the mask from the laminated film. In this process, the laminated film consisting of a metal silicide layer on which a resist mask is formed, and a polycrystalline silicon layer formed over a substrate, can be given vertical patterning profile edge, and the uniformity of the etching rate in the substrate is enhanced. Further, as a deposition gas is not used in the present process, the occurrence of loose particles is restrained.

10 Claims, 9 Drawing Sheets

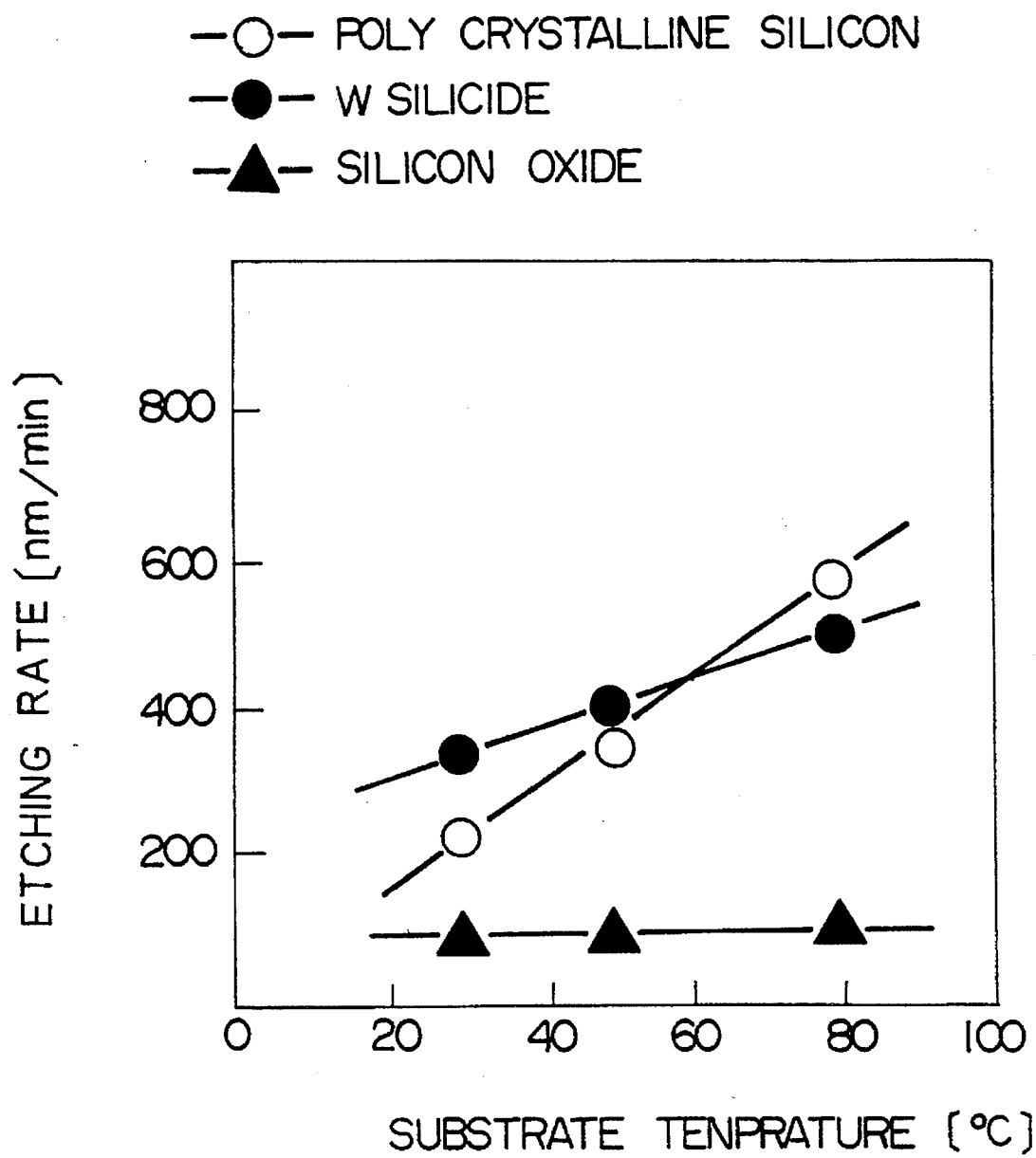

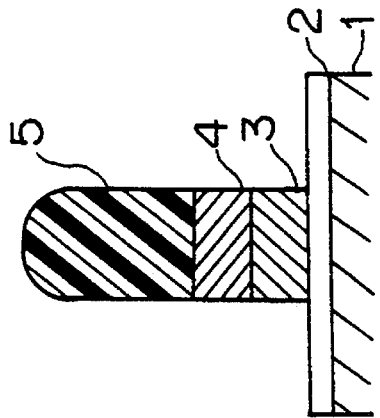
Fig. 2A  35 °C
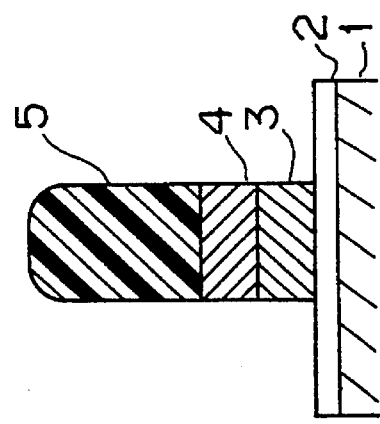
Fig. 2B  60 °C
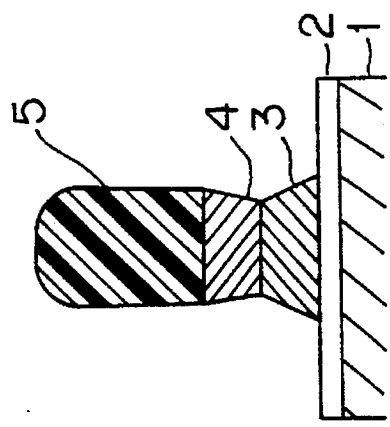
Fig. 2C  100 °C

PROCESS FOR PREPARATION OF SEMICONDUCTOR DEVICE

BACKGROUND OF THE INVENTION

1. Field of the Invention

The present invention relates to a process for the preparation of a semiconductor device. More particularly, the present invention relates to a process for the preparation of a semiconductor device, in which a dry etching of a laminated film consisting of a metal silicide silicon layer and non-single crystalline layer is employed.

2. Description of the Related Art

In the field of the production of semiconductor devices, the recent increase of the degree of integration and density of ICs, has led to the need for a fine processing technique to cope with this increase. Under these circumstances, a laminated film consisting of a metal silicide layer having an electrical resistivity and a polysilicon layer has been widely used. When etching this film, a dry etching method is employed in which $SF_6$ and $CCl_4$ are used as an etching gas.

In the past method, however, an undercutting is apt to be formed in the etched pattern, and thus the accuracy of the pattern dimensions is low, and further, the selectivity of a polycrystalline silicon to a silicon dioxide is low. Accordingly, it has become necessary to develop a fine-pattern forming technique by which the above problems are solved and a fine patterning obtained.

To date, the following publications are known which disclose a dry etching method by which a laminated film consisting of a metal silicide layer and a polycrystalline silicon is etched.

(A) A dry etching by a mixed gas of $SF_6$ and $O_2$: [Reference: polycide-structure etching by an $SF_6$ glow discharge, using a low cycle excitation parallel flat-type reactor: M. E. Coe. S. H. Rogers: solid state technology (Japanese edition) 1982];

(B) Two-step etching consisting of a first reactive ion etching using a fluorine-contained gas, for a metal silicide, and a second reactive ion etching using a chlorine-type gas, for a polycrystalline silicon (Japanese Examine Patent Publication (Kokoku) No. 61- 168228 filed by Sharp K. K.); and (C) A dry etching using a mixed gas $Cl_2$ and $BCl_3$, for a double film consisting of a metal silicide layer and a polycrystalline silicon (Japanese patent application No. 59-85051).

Also, the following publications disclose a method of dry etching a single film of a metallic layer having a high melting point, or a metal silicide layer having a high melting point.

(D) A reactive ion etching using a mixed gas of $Cl_2$ and $O_2$ for a metal silicide single layer (Japanese examined patent publication (Kokoku) No. 60-064476, filed by Fujitsu Co., Ltd.; Japanese examined patent publication (Kokoku) No. 01-243430, by Nippon Electric Co., Ltd.; and Japanese examined patent publication (Kokoku) No. 02-094520, filed by Nippon Electric Co., Ltd.).

In the above method (A) it is impossible to obtain a vertical patterning due to large undercutting remaining in the etched pattern.

In the above method (B), $SF_6$ gas and $CCl_4$ gas are used for the first etching step, and $CCl_4$ gas and $O_2$ gas are used for the second etching step. Nevertheless, it is impossible to obtain a vertical pattern even though the amount of undercutting is reduced to a certain extent. Furthermore, the selectivity to the silicon dioxide in the first etching step is low, e.g., 1 to 2, and the selectivity in the second etching step is also low, e.g., 2 to 3.

Also, differences exist between the patterning profile obtained at the area wherein the space to be etched per unit space is large (hereinafter called the coarse area), and the area wherein the space to be etched per unit space is small (hereinafter called the thick area).

Therefore, this method is not suitable for the preparation of the semiconductor device having both coarse and thick portions. Furthermore, use of the $CCl_4$ gas is now banned under environmental protection laws, e.g., the Freon-control law.

In the above method (C), $BCl_3$ gas which is apt to form by-products, i.e., deposits, and is called a deposition gas, was successfully employed to form a vertical pattern in which the laminated film is protected by a side wall. Nevertheless, a small amount of $BCl_3$ gas causes a change of the etching rate, and accordingly, the pattern is not uniform in the field of the substrate, and thus the reproducibility is bad due to the influence of the $BCl_3$ deposited in the etching reaction chamber. Also, because $BCl_3$ is a deposition gas, a gas flow meter becomes clogged and the particles are deposited in the etching reaction chamber. A similar problem arises if the $BCl_3$ is replaced by $SiCl_4$.

In the above method (D), the laminated film consisting of the metal silicide layer and the polycrystalline film is etched, but a vertical side is not obtained, and accordingly, the etching rate of the upper metal silicide layer is faster than that of the lower polycrystalline silicon layer. Also, the uniformity of the etching rate of the metal silicide layer is bad, and thus the obtained pattern is not uniform in the substrate.

Under these circumstances, there is a need to develop a dry etching technique by which the laminated film consisting of the metal silicide compound layer and the polycrystalline silicon layer can be fabricated to form a vertical side in profile without employing a gas which can not be permitted to be used under the Freon Regulations and a deposition gas, and by employing this technique a fine pattern can be obtained without an edge profile between the coarse area and the thick area of the pattern, and in the substrate, while having a high selectivity to the lower silicon dioxide layer.

SUMMARY OF THE INVENTION

Therefore, a primary object of the present invention is to provide a process for the preparation of a semiconductor device, which comprises the steps of:

(a) forming a mask including an organic film on a laminated film consisting of a metal silicide layer and a non-single crystalline silicon layer formed over a substrate on which an oxide layer is formed, (b) etching the laminated film under a plasma atmosphere of a mixed gas including a chlorine gas and an oxygen gas by heating the substrate to a temperature of 60° C. or more to fabricate the laminated film into an almost vertical pattern in section, and (c) removing the mask from the laminated film.

Another object of the present invention is provide a process for the preparation of a semiconductor device, which comprises the steps of:

(a) forming a mask including an organic film on a laminated film consisting of a metal silicide layer and a non-single crystalline silicon layer formed over a substrate on which an oxide layer is formed, (b) etching the laminated film under a plasma atmosphere of a mixed gas including a chlorine gas and an oxygen gas by heating the substrate to a temperature of 60° C. or more to remove the metal silicide layer and the non-single crystalline layer, (c) over-etching the non-single crystalline film under a plasma atmosphere of a hydrogen bromide gas by heating the substrate to a temperature of 60° C. or more to remove the non-single crystalline film, thereby fabricating the laminated film into an almost vertical pattern in section, and (d) removing the mask from the laminated film.

A further object of the present invention is to provide a process for the preparation of a semiconductor device, which comprises the steps of:

(a) forming a mask including an organic film and an inorganic film on a laminated film consisting of a metal silicide layer and a polysilicon layer formed over a substrate on which an oxide layer is formed, (b) etching the metal silicide layer by heating the substrate to a temperature of 60° C. or more to remove the metal silicide layer and the non-single crystalline silicon layer, (c) selectively removing the mask of the organic film from the laminated film, (d) over-etching the non-single crystalline silicon film under a plasma atmosphere of a gas including the hydrogen bromide gas while using the inorganic film as the mask, by heating the substrate to a temperature of 60° C. or more to remove the non-single crystalline silicon, thereby fabricating the laminated film into an almost vertical pattern in section.

In the present invention, by the term "non-single crystalline silicon" is meant a polycrystalline silicon, an amorphous silicon, and a silicon in which the fine crystalline silicon is dispersed in the amorphous silicon.

BRIEF DESCRIPTION OF THE DRAWINGS

The above objects and advantages of the present invention will be made clear by the following description of the present invention, with reference to the accompanying drawings, wherein:

FIG. 1 is a graph showing the relationship between the temperature of the substrate and the etching rate;

FIGS. 2A through 2C are sectional views illustrating the relationship between the temperature of the substrate and etched patterns;

DESCRIPTION OF THE PREFERRED EMBODIMENTS

Figure 3:
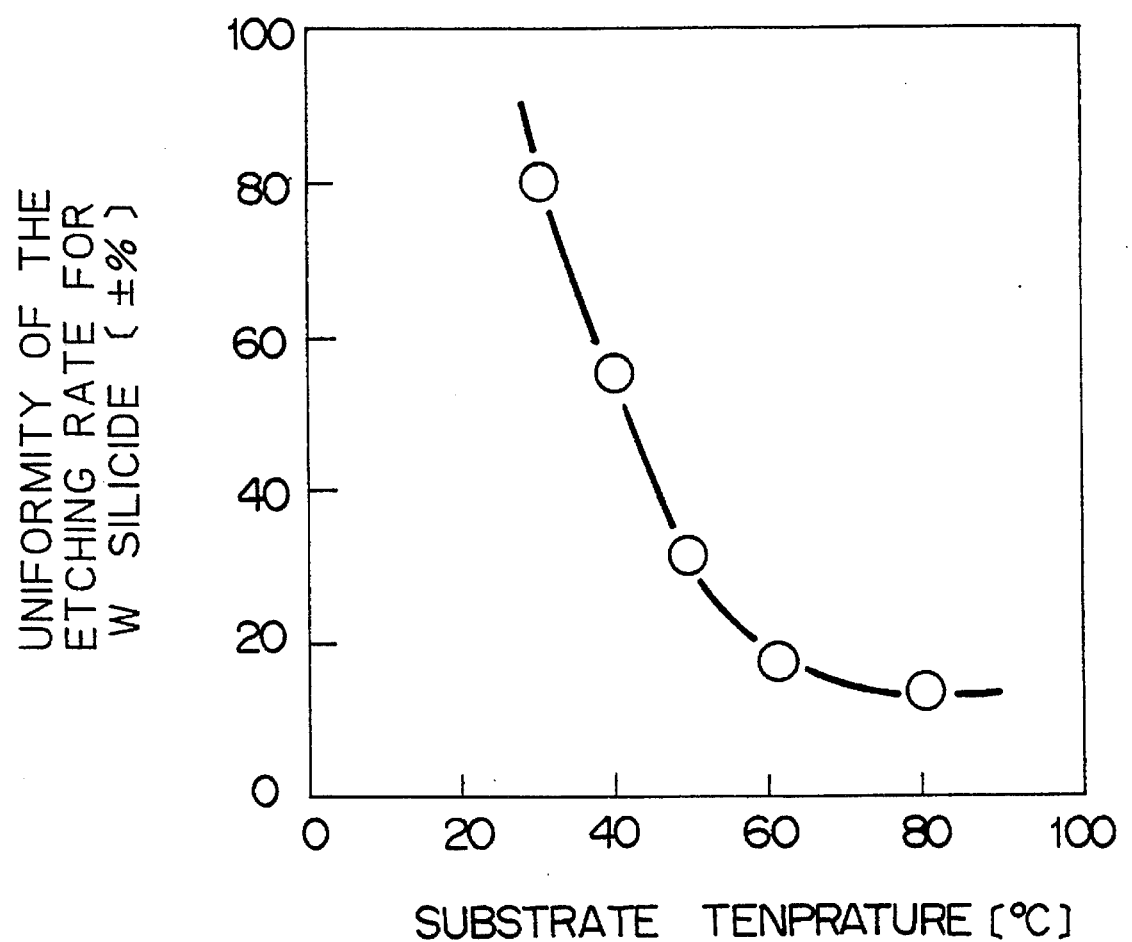
FIG. 3 is a graph showing the relationship between the temperature of the substrate and the uniformity of the etch rate for W silicide.

To fabricate a laminated film consisting of a metal silicide layer and a polycrystalline silicon to have an almost vertical edge profile, it is necessary to obtain an etching rate for the metal silicide layer which is the same as the rate for the polycrystalline silicon layer, or it is necessary to obtain an etching rate of a metal silicide layer which is faster than that of the polycrystalline silicon layer.

The present inventors carried out the following research in which the substrate on which the laminated film consisting of the metal silicide compound (in this experiment, tungsten silicide was employed) film and the polycrystalline silicon was heated to a temperature of 60° C. using a positive-working photoresist (hereinafter abbreviated as "resist") to etch the laminated film by using a mixed gas of $Cl_2$ and $O_2$, and as a result, found that the etching rate of the tungsten silicide (hereinafter abbreviated as "W silicide") was almost the same as that of the polycrystalline silicon. Then further experiments were made in which the substrate was heated at a temperature of 80° C. to effect the etching, and as a result, it was found that the etching rate of the W silicide is faster than that of the polycrystalline silicon. FIG. 1 illustrates the relationship between the temperature of the substrate and the etching rate for each layer, i.e., the polycrystalline silicon layer, the W silicide layer, and the silicon dioxide layer.

The inventors then investigated the relationship between the temperature of the substrate and the obtained pattern, and obtained the results shown in FIG. 2. As shown in FIG. 2, the laminated film consisting of the W silicide layer 4 and polycrystalline silicon layer 3 (hereinafter abbreviated as "W polycide layer") was etched to form an almost vertical edge profile when the substrate 1 was heated to a temperature of 60° C. or more. When the temperature of the substrate became higher than 150° C., the resist 5 was melted and deformed, and thus could not be used as a mask. Note, the numeral 2 in FIG. 2 represents silicon dioxide. Therefore, the upper limit of the temperature of the substrate is 150° C. Also, the etching rate of the silicon dioxide is not changed when the temperature of the substrate becomes high, as shown in FIG. 1. Therefore, the higher the temperature of the substrate, the higher the selectivity of the polycrystalline silicon to the silicon dioxide. When the temperature of the substrate became 80° C., this selective ratio was 4 to 5, which value is higher than that of the selectivity obtained by the method described in the publication (13).

Furthermore, the uniformity of the etching rate of the W silicide depends on the temperature of the substrate, and the higher the temperature of the substrate, the greater the uniformity of the etching rate as shown in FIG. 3. Therefore, it is important to control the temperature of the substrate when etching the W polycide.

Figure 4:
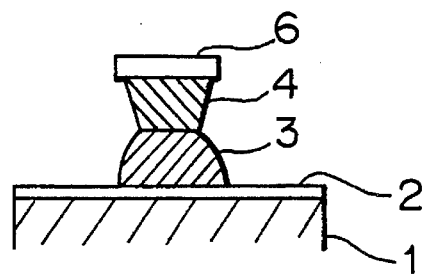
FIG. 4 is a schematic illustration showing an edge profile of the edged W polycide when using a silicon dioxide mask.

Also, when using silicon dioxide instead of the resist as the mask, the W silicide was heated to a temperature of 80° C. while employing a mixed gas of $Cl_2$ and $O_2$ as an etching gas. As the result of this etching, a pattern with undercutting and almost no vertical edge profile was obtained as shown in FIG. 4. Therefore, it is obviously necessary to employ an organic mask, such as at least a resist, in this invention. The W polycide covered by a resist mask was heated to a temperature of 80° C. while using hydrogen bromide as the gas for etching, and as the result, it was found that the W silicide was only very slightly etched, and therefore, hydrogen bromide can not be employed as the etching gas for etching the W silicide. Nevertheless, by employing hydrogen bromide as the etching gas, polycrystalline silicon covered by the resist mask was heated to a temperature of 80° C. and as a result, it was found that an almost vertical edge profile was obtained.

Accordingly, based on the above phenomenon, hydrogen bromide is employed as the etching gas in the second etching step. The reasons for employing hydrogen bromide are as follows: W silicide is only slightly etched with hydrogen bromide, due to the slow etching rate thereof, and further, the selective ratio to silicon dioxide in the case of hydrogen bromide is large.

Furthermore, polycrystalline silicon was heated to a temperature of 80° C. while employing silicon dioxide instead of the resist as the etching mask, and as a result, it was found that an almost vertical edge profile was obtained. Also, it was found that the selectivity of polycrystalline silicon to silicon dioxide was 100 or more, and thus a resist including carbon which increases the etching rate for silicon dioxide, was not employed.

As shown above, it was found that W polycide was fabricated to form an almost vertical edge profile by etching the W silicide coated by the resist mask while heating the W silicide to a temperature of 80° C. and using a mixed gas of $Cl_2$ and $O_2$, followed by etching the polycrystalline silicon by heating the polycrystalline while employing the resist and W silicide as the mask and using hydrogen bromide as the etching gas. In this case, the obtained selectivity of the polycrystalline to the lower silicon dioxide is about 10 to 20.

As can be seen from the above description, the above two etching steps are necessary when a selectivity of more than five, to the lower silicon dioxide, is required.

Note, when hydrogen bromide is employed in the second etching as the etching gas, the following effects are obtained. Namely, the $Wo_x$ and $Wcl_x$ particles adhered to the inner wall of the reaction chamber, which are formed in the first etching step, were covered by the Si $Br_x$ particles, and therefore, the $Wo_x$ and $WCl_x$ particle are not removed. Therefore, the $Wo_x$ and $WCl_x$ particles are not adhered to wafers as dust.

The present invention will now be described in detail with reference to the following examples, that by no means limit the scope of the invention.

EXAMPLE

Figure 5:
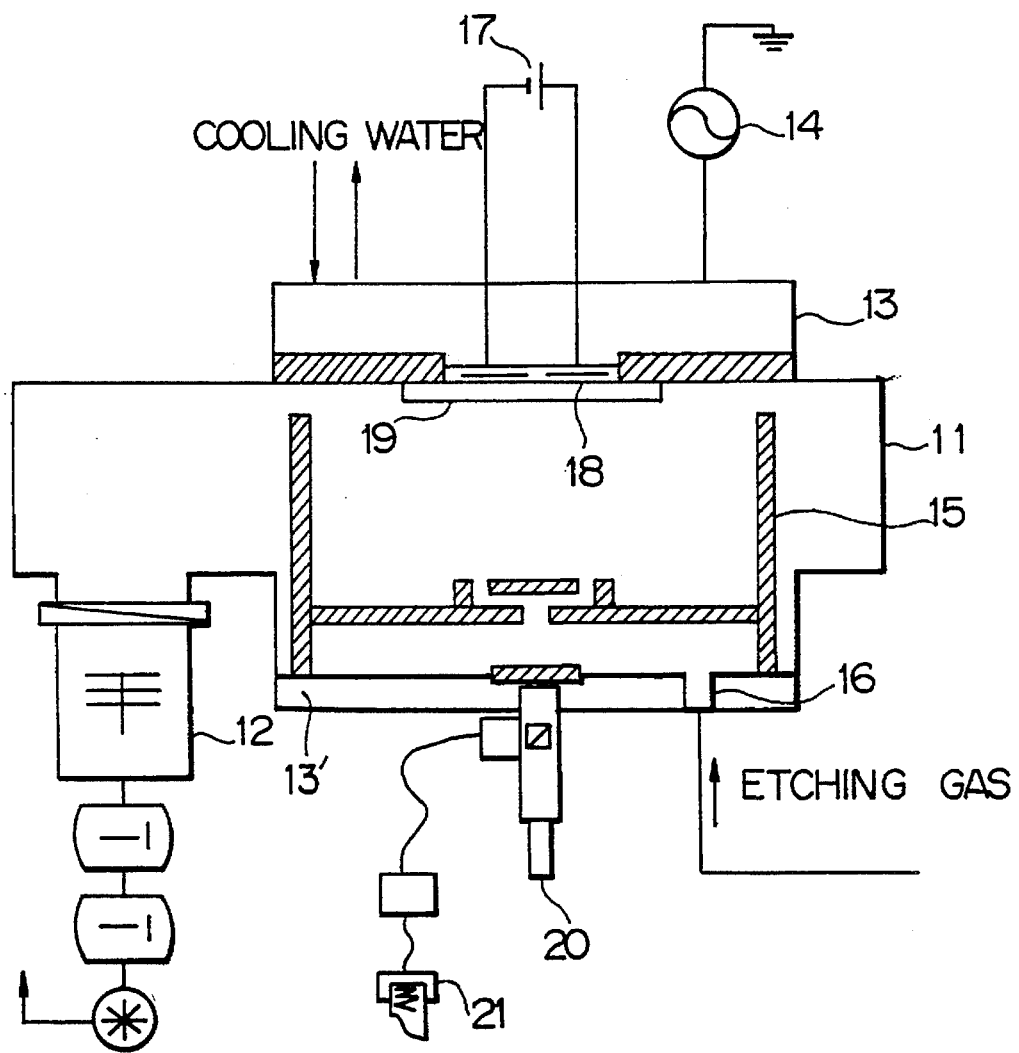
FIG. 5 is a schematic representation of the RIE system used in the embodiment of the present invention.

In the following Examples, the parallel plate-type RIE system is employed, FIG. 5 is a schematic representation of the one type of such an RIE system.

In this RIE system, 11 is a chamber, 12 is an exhaust gas system, 13 and 13' is an electrode, 14 is a RF electric power supply, 15 is a quartz cover, 16 is a gas inlet, 17 is a current electric supply, 18 is an electrostatic chuck, 19 is a wafer, 20 is a laser interferometer, and 21 is a recorder.

In the RIE system shown in FIG. 5, a wafer stage is provided with a water cooling unit, and the temperature of the wafer is controlled by the controlling the temperature of the circulation water. Also, a determination of the etching rate of the metal silicon compound and of the polycrystalline silicon, and a detecting of the end point are carried out thereby.

Figure 6B:
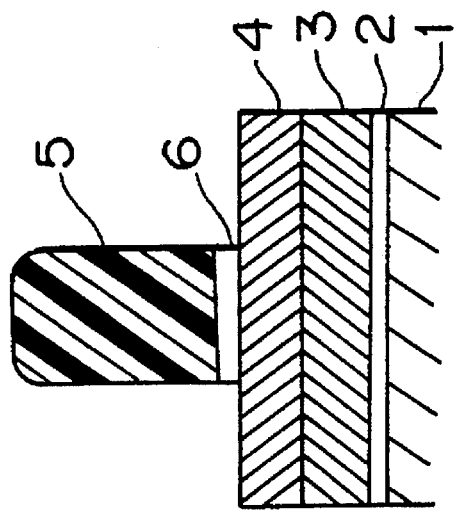
FIGS. 6A and 6B are sectional views illustrating a sample employed in the embodiment of the present invention.
Figure 6A:
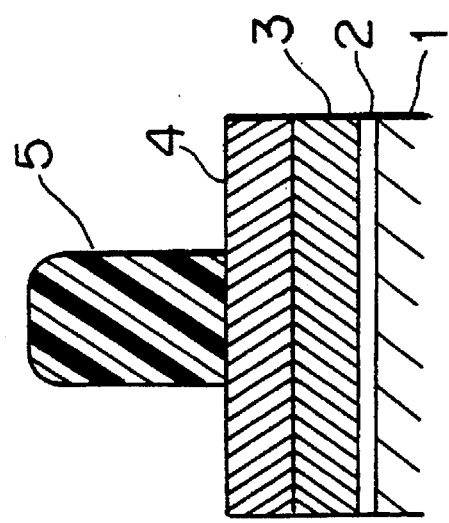

FIG. 6 is a schismatic illustration of a sample employed in the embodiment of the present invention, wherein FIG. 6A is a sectional view of a sample in which a polycrystalline silicon layer 3 having a thickness of 200 nm and a W silicide layer 4 having a thickness of 200 nm are formed on a silicon substrate 1, and a resist mask 5 is selectively coated over the W silicide layer 4. The numeral 2 represents a silicon dioxide layer.

FIG. 6B is a sectional view of a sample in which a polycrystalline silicon layer 3 having a thickness of 200 nm and a W silicide layer 4 having thickness of 200 nm are formed over a silicon substrate 1, and a upper resist 5 and a lower silicon dioxide mask 6 are selectively coated on %he W silicide layer 4.

EXAMPLE 1

Using a mixed gas of $Cl_2$ and $O_2$ as an etching gas, the sample illustrated in FIG. 2A was etched under the following conditions while changing the temperature of the substrate 1. Note, the total flow amount was fixed at an amount of 100 sccm. The etching conditions were as follows;

Mixed ratio of $O_2$: 11%

RF power: 500 W (1.1 W/cm$^2$)

Pressure: 0.05 Torr

FIG. 1 illustrates the relationship between the etching rate of each layer and the temperature of the substrate. As the temperature of the substrate becomes higher, the etching rate of the W silicide and the polycrystalline silicon becomes faster, but the etching rate of the silicon dioxide remains fixed. As a result, the selectivity becomes higher as the temperature of the substrate becomes higher, and when the temperature of the substrate reached 80° C., the selectivity of the polycrystalline to the silicon dioxide was 5.0.

FIGS. 2A–2C illustrate the relationship between the temperature of the substrate and the edges of the pattern of the layers. As seen from FIGS. 2A–2C, when the temperature of the substrates was 60° C. or more, the W silicide layer 4 was etched to form an almost vertical edge profile.

FIG. 3 shows the relationship between the temperature of the substrate and the uniformity of the etching rate for the W silicide layer 4. When the temperature of the substrate becomes higher the uniformity of the etching rate for the W silicide layer 4 is good, and when the temperature of the substrate is 60° C. or more, the uniformity of the etching rate is fixed at almost ±15%.

EXAMPLE 2

Using a mixed gas of $Cl_2$ and $O_2$ as an etching gas, the sample illustrated in FIG. 6A was etched under the following conditions, while changing the mixed ratio of $O_2$.

The etching conditions were as follows;

Stage temperature: 80° C.

RF power: 500 W (1.1 W/cm$^2$)

Pressure: 0.05 Torr

Figure 7:
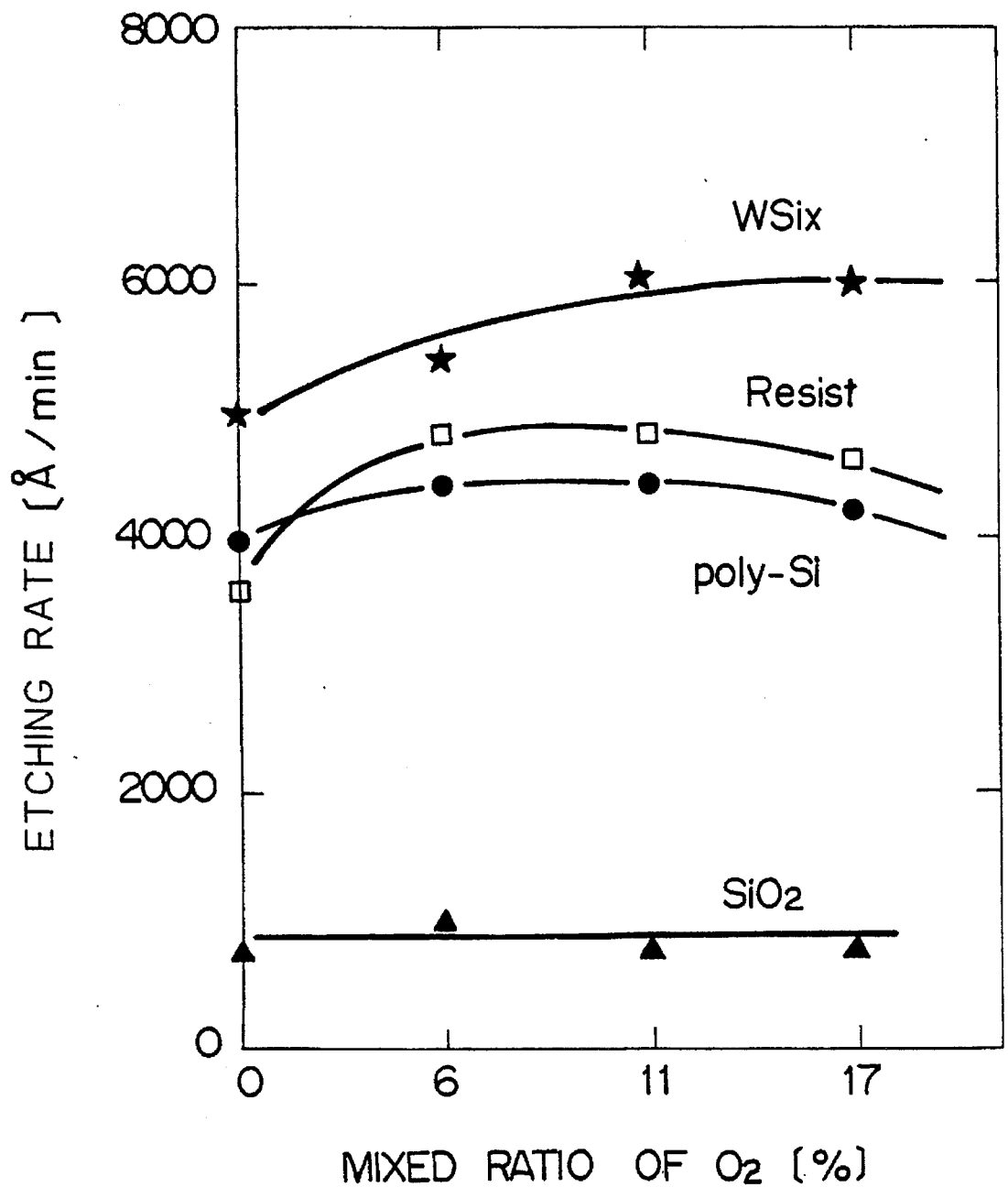
FIG. 7 is a graph showing the relationship between the mixed ratio of $O_2$ and the etching rate.

FIG. 7 illustrates the relationship between the etching rate of each film and the mixed ratio of $O_2$. As the mixed ratio of $O_2$ becomes higher, the etching rate of each layer becomes faster. Conversely, when the mixed ratio of $O_2$ exceed 11%, the etching rate becomes slow.

Figure 8A:
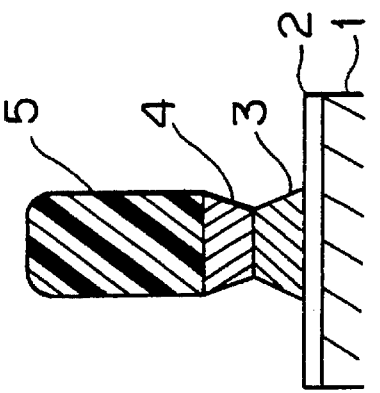
FIG. 8A through 8C are sectional views illustrating the relationship between the mixed ratio of $O_2$ and the edge profile.
Figure 8B:
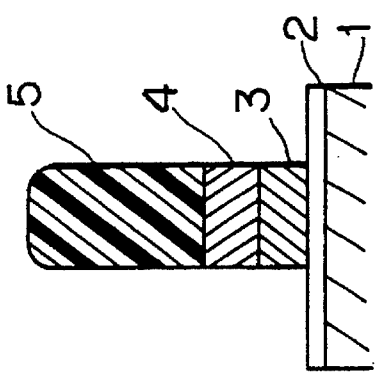
Figure 8C:
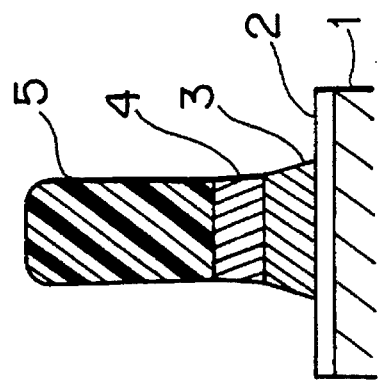

FIGS. 8A–8C illustrate the relationship between the mixed ratio of $O_2$ and the etching profile. When the mixed ratio of $O_2$ is 6% or less, the etching profile has a reverse taper, but when the mixed ratio of $O_2$ is within a range of 6% to 30%, an almost vertical etching profile is obtained. At a mixed ratio of $O_2$ of 30% or more, however, a side etched profile is obtained.

Figure 9:
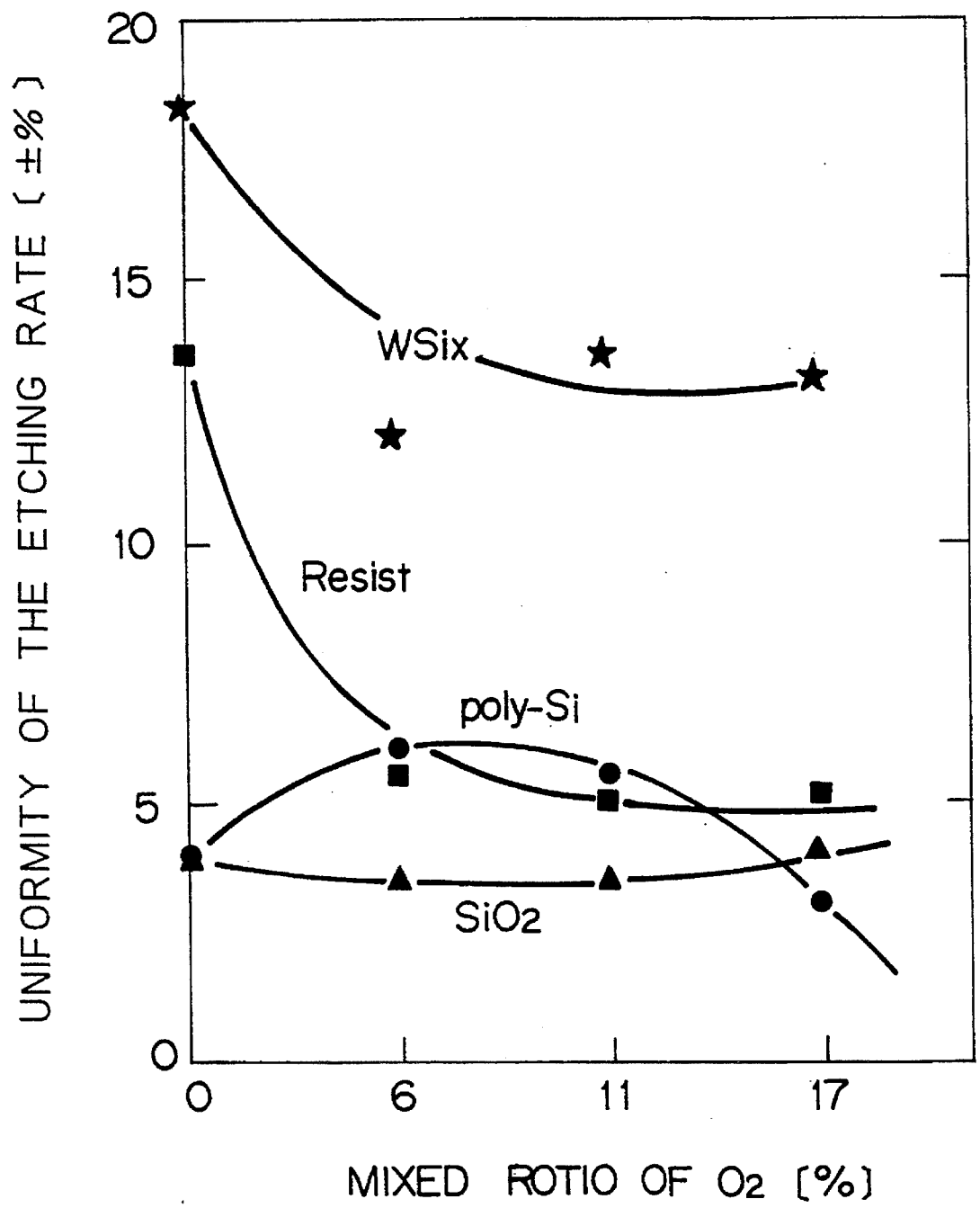
FIG. 9 is a graph showing the relationship between the mixed ratio of $O_2$ and the uniformity of the etching rate.

FIG. 9 illustrates the relationship between the mixed ratio of $O_2$ and the uniformity of etching rate for the W silicide layer 4, As the mixed ratio of $O_2$ becomes higher, the uniformity of the etching rate for the W silicide layer 4 becomes good, and when the mixed ratio of $O_2$ is more than 6%, the uniformity of the etching rate becomes fixed at almost ±14%.

After the etching step, the deposits built up on the wall of the vacuum chamber were peeled off and fell onto the wafer as particles. The amounts of such particles were determined, and a result, 280 particles having a size of 0.2 μm or over in number were found. Also, after the etching gas step was carried out, the plasma treatment process using hydrogen bromide gas was effected. The treatment conditions were as follows: Flow rate of hydrogen bromide 100 sccm; inner pressure of the treatment chamber 130 m Torr; and RF power 300 w. After the plasma treatment, the amounts of particles were measured as above, and as a result, 30 particles having a size of 0.2 μm or over were found. From these results, it was found that the occurrence of particles was substantially prevented by a plasma treatment using hydrogen bromide.

EXAMPLE 3

Figure 10:
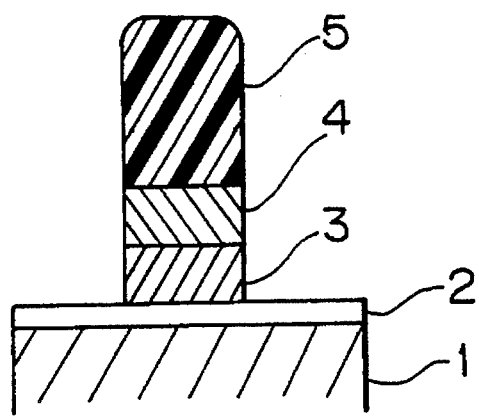
FIG. 10 is a sectional view illustrating the pattern obtained by the embodiment of the present invention.

Using a mixed gas of $Cl_2$ and $O_2$ in the first etching step, and using HBr in,the second etching step, the sample illustrated in FIG. 6(A) was etched under the following conditions, and as a result, an almost vertical etching profile as shown in FIG. 10 was obtained. Also, the obtained etching profile was vertical regardless of the patterning of each of the coarse area and the thick area.

The selectivity to the silicon dioxide layer was 5 in the first etching step, and 11 in the second etching step. The uniformity of the etching rate for the polycrystalline silicon when using HBr was ±10%.

| Parameter | | First etching step | Second etching step |
|---|---|---|---|
| Substrate temperature | (°C) | 80 | 80 |
| Mixed ratio of $O_2$ | (%) | 11 | — |
| Flow amount of HBr | (sccm) | — | 100 |
| RF power | (W) | 500 | 500 |
| Pressure | (Torr) | 0.05 | 0.20 |

EXAMPLE 4

Using a mixed gas of $Cl_2$ and $O_2$ in the first etching step, and using HBr in the second etching step, the sample illustrated in FIG. 6(A) was etched under the following conditions.

| Parameter | | First etching step | Second etching step |
|---|---|---|---|
| Substrate temperature | (°C) | 80 | 80 |
| Mixed ratio of $O_2$ | (%) | 11 | — |
| Flow amount of HBr | (sccm) | — | 100 |
| RF power | (W) | 500 | 300 |
| Pressure | (Torr) | 0.05 | 0.10 |

In FIGS. 8A–8C, the numerals 1, 2, 3, 4 and 5 have the same meaning as those of FIG. 6A.

As a result, an almost vertical etching profile as shown in FIG. 10 was obtained. Also, the obtained etching profile was vertical regardless of the patterning of each of the coarse area and the thick area.

The selectivity to the under silicon oxide layer was 5 in the first etching step, and 17 in the second etching step. The uniformity of the etching rate for the polycrystalline silicon when using HBr was ±5%.

EXAMPLE 5

Using a mixed gas of $Cl_2$ and $O_2$ in the first etching step, and using HBr in the second etching step, the sample illustrated in FIG. 6(B) was etched under the following conditions. Note, the resist was removed after the completion of the first etching step but before beginning the second etching step.

| Parameter | | First etching step | Second etching step |
|---|---|---|---|
| Substrate temperature | (°C) | 80 | 80 |
| Mixed ratio of $O_2$ | (%) | 11 | — |
| Flow amount of HBr | (sccm) | — | 100 |
| RF power | (W) | 500 | 300 |
| Pressure | (Torr) | 0.05 | 0.10 |

Figure 11:
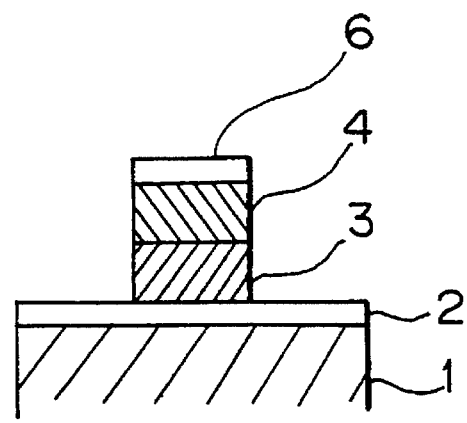
FIG. 11 is a sectional view illustrating the pattern obtained by another embodiment of the present invention.

As a result, an almost vertical etching profile as shown in FIG. 11 was obtained. Also, the obtained etching profile was vertical regardless of the patterning of each of the coarse area and the thick area.

The selectivity to the under silicon dioxide layer was 5 in the first etching step, and 100 in the second etching step. The uniformity of the etching rate for the polycrystalline silicon when using HBr for the second etching step was ±5%.

EXAMPLE 6

Using a mixed gas of $Cl_2$ and $O_2$ in the first etching step, and using HBr in the second etching step, the sample illustrated in FIG. 6(B), wherein the silicon dioxide was replaced by silicon nitride, was etched under the following conditions, and a result, an almost vertical etching profile as shown in FIG. 11 was obtained. Also, the obtained etching profile was vertical regardless of the patterning of each of the coarse area and the thick area.

The selectivity to the under silicon dioxide layer was 5 in the first etching step, and 100 in the second etching step. The uniformity of the etching rate for the polycrystalline silicon when using HBr was ±5%.

As described above, in accordance with the present invention, the laminated film consisting of a metal silicide layer on which a resist mask is formed, and a polycrystalline silicon layer formed over a substrate, can be given vertical patterning profile edge by heating the substrate to a temperature of 60° C. or more under a plasma atmosphere of a mixed gas of $Cl_2$ and $O_2$.

Furthermore, as a result of heating the substrate, the uniformity of the etching rate of the substrate is enhanced, and further, as a deposition gas is not used in the present process, the occurrence of loose particles is restrained. Accordingly, the present process provides an improvement of the fine manufacturing technique when producing semiconductor devices.

I claim:

1. A process for the preparation of a semiconductor device, which comprises the steps of:

forming a mask including an organic film on a laminated film consisting of a W silicide layer and a non-single crystalline silicon layer formed over a substrate on which an oxide layer is formed;

etching the laminated film under a plasma atmosphere of a mixed gas including a chlorine gas and an oxygen gas but not including a sulfur-bearing gas to fabricate the laminated film into an almost vertical pattern in section, while maintaining the temperature of the substrate at 60° C. or more; and removing the mask from the laminated film.

2. A process for the preparation of a semiconductor device, which comprises the steps of:

forming a mask including an organic film on a laminated film consisting of a W silicide layer and a non-single crystalline silicon layer formed over a substrate on which an oxide layer is formed;

etching the laminated film under a plasma atmosphere of a mixed gas including a chlorine gas and an oxygen gas to remove the W silicide layer and the non-single crystalline layer, while maintaining the temperature of the substrate at 60° C. or more;

over-etching the non-single crystalline film under a plasma atmosphere of a hydrogen bromide gas to remove the non-single crystalline film, therein fabricating the laminated film into an almost vertical pattern in section, while maintaining the temperature of the substrate at 60° C. or more; and removing the mask from the laminated film.

3. A process for the preparation of a semiconductor device, which comprises the steps of:

forming a mask including an organic film and an inorganic film on a laminated film consisting of a W silicide layer and a polysilicon layer formed over a substrate on which an oxide layer is formed;

etching the W silicide layer to remove the metal silicide layer and the non-single crystalline silicon layer, while maintaining the temperature of the substrate at 60° C. or more;

selectively removing the mask of the organic film from the laminated film; and over-etching the non-single crystalline silicon film under a plasma atmosphere of a gas including the hydrogen bromide gas while using the inorganic film as the mask to remove the non-single crystalline silicon, therein fabricating the laminated film into an almost vertical pattern in section, while maintaining the temperature of the substrate at 60° C. or more.

4. A process according to claim 1, in which mixed ratio of the oxygen gas in the mixed gas of the chlorine gas and the oxygen gas is 6 to 30% based on total amount of the chlorine gas and the oxygen gas.

5. A process according to claim 3, in which the inorganic film in the mask comprised of a laminated film of the organic film and the inorganic film is made of a silicon dioxide or a silicon nitride.

6. A process according to claim 1, in which the temperature of the substrate is not more than 160° C.

7. A process according to claim 2, in which a mixed ratio of the oxygen gas in the mixed gas of the chlorine gas and the oxygen is 6 to 30% based on a total amount of the chlorine gas and the oxygen gas.

8. A process according to claim 3, in which a mixed ratio of the oxygen gas in the mixed gas of the chlorine gas and the oxygen is 6 to 30% based on a total amount of the chlorine gas and the oxygen gas.

9. A process according to claim 2, in which the temperature of the substrate is not more than 160° C.

10. A process according to claim 3, in which the temperature of the substrate is not more than 160° C.

* * * * *